United States Patent
Katsuta

(10) Patent No.: US 12,100,713 B2
(45) Date of Patent: *Sep. 24, 2024

(54) DISPLAY DEVICE

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/235,146

(22) Filed: Aug. 17, 2023

(65) Prior Publication Data

US 2024/0063231 A1 Feb. 22, 2024

(30) Foreign Application Priority Data

Aug. 22, 2022 (JP) .................. 2022-131884

(51) Int. Cl.
*H01L 27/12* (2006.01)
*G09G 3/20* (2006.01)
*G09G 3/3233* (2016.01)

(52) U.S. Cl.
CPC ......... *H01L 27/124* (2013.01); *G09G 3/2096* (2013.01); *G09G 3/3233* (2013.01); *G09G 2320/0247* (2013.01); *G09G 2320/046* (2013.01); *G09G 2330/027* (2013.01)

(58) Field of Classification Search
CPC .. H01L 27/124; G09G 3/2096; G09G 3/3233; G09G 2320/0247; G09G 2320/046; G09G 2330/027
See application file for complete search history.

(56) References Cited

U.S. PATENT DOCUMENTS

| | | | | |
|---|---|---|---|---|
| 10,446,077 | B2 * | 10/2019 | Yang | G09G 3/3233 |
| 2002/0080133 | A1 * | 6/2002 | Eu | G09G 3/3648 |
| | | | | 345/212 |
| 2003/0189564 | A1 * | 10/2003 | Lee | G09G 3/3648 |
| | | | | 345/212 |

(Continued)

FOREIGN PATENT DOCUMENTS

| | | |
|---|---|---|
| JP | 2001-022326 A | 1/2001 |
| JP | 2008-299253 A | 12/2008 |

OTHER PUBLICATIONS

Notice of Allowance issued in U.S. Appl. No. 18/235,041 on Feb. 15, 2024. 9 pages.

*Primary Examiner* — William Lu
(74) *Attorney, Agent, or Firm* — K&L Gates LLP

(57) ABSTRACT

A display device includes a pixel, a scanning line, a signal line, and a drive circuit configured to be supplied with a first power supply voltage signal of a positive value and a second power supply voltage signal of a negative value. The drive circuit includes: a gate driver configured to supply a scanning signal to the scanning line; a signal line selection circuit configured to supply a pixel signal to the signal line; and a display control circuit. The display control circuit is configured to, at first time in a power-off sequence, supply the first power supply voltage signal to the scanning line, supply a GND potential to the common electrode, and supply an adjustment potential of a positive value to the signal line. The display control circuit is configured to supply the GND potential to the scanning line at second time after the first time.

4 Claims, 12 Drawing Sheets

(56) References Cited

U.S. PATENT DOCUMENTS

| | | | |
|---|---|---|---|
| 2005/0057470 A1* | 3/2005 | Tobita | G09G 3/20 345/89 |
| 2006/0289893 A1* | 12/2006 | Lee | G09G 3/3677 257/147 |
| 2006/0290616 A1* | 12/2006 | Murayama | H10K 59/13 345/76 |
| 2009/0009503 A1* | 1/2009 | Tajiri | G09G 3/3655 345/87 |
| 2013/0234919 A1* | 9/2013 | Choi | G09G 3/3677 345/92 |
| 2014/0168184 A1* | 6/2014 | Kim | G09G 3/3233 345/79 |
| 2015/0009195 A1* | 1/2015 | Saitoh | G02F 1/136286 345/87 |
| 2015/0269900 A1* | 9/2015 | Iwamoto | G09G 3/3648 345/100 |
| 2016/0027394 A1* | 1/2016 | Yamamoto | G09G 3/3677 345/212 |
| 2016/0078818 A1* | 3/2016 | Kang | G09G 3/3291 323/280 |
| 2016/0155409 A1* | 6/2016 | Jeoung | G09G 3/3696 345/214 |
| 2017/0004800 A1* | 1/2017 | Park | G09G 3/3648 |
| 2018/0061293 A1* | 3/2018 | Park | G09G 3/006 |
| 2018/0083078 A1* | 3/2018 | Park | H10K 59/1213 |
| 2020/0150475 A1* | 5/2020 | Ueyama | G02F 1/13439 |
| 2022/0122512 A1* | 4/2022 | Lee | G09G 3/3233 |

* cited by examiner

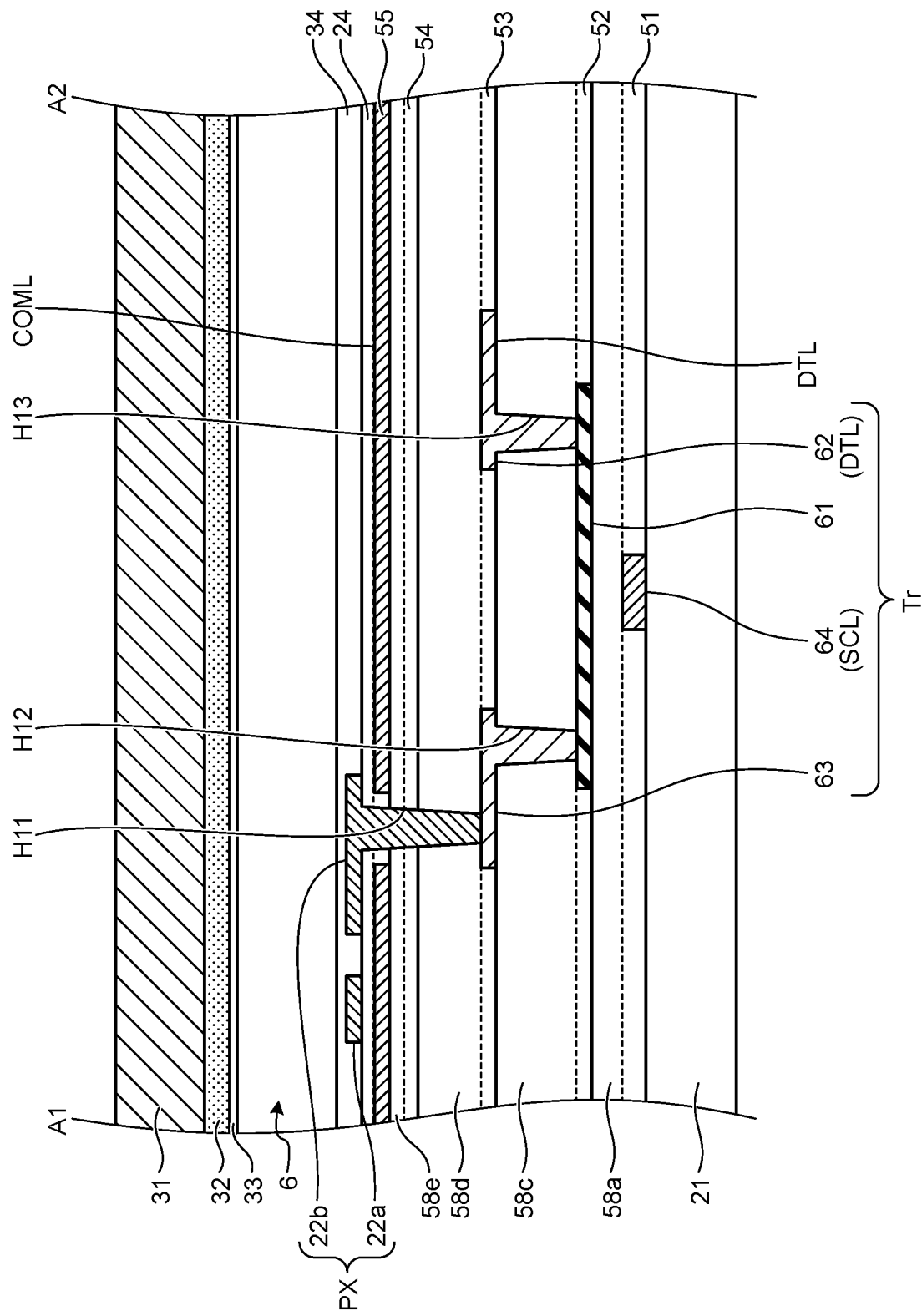

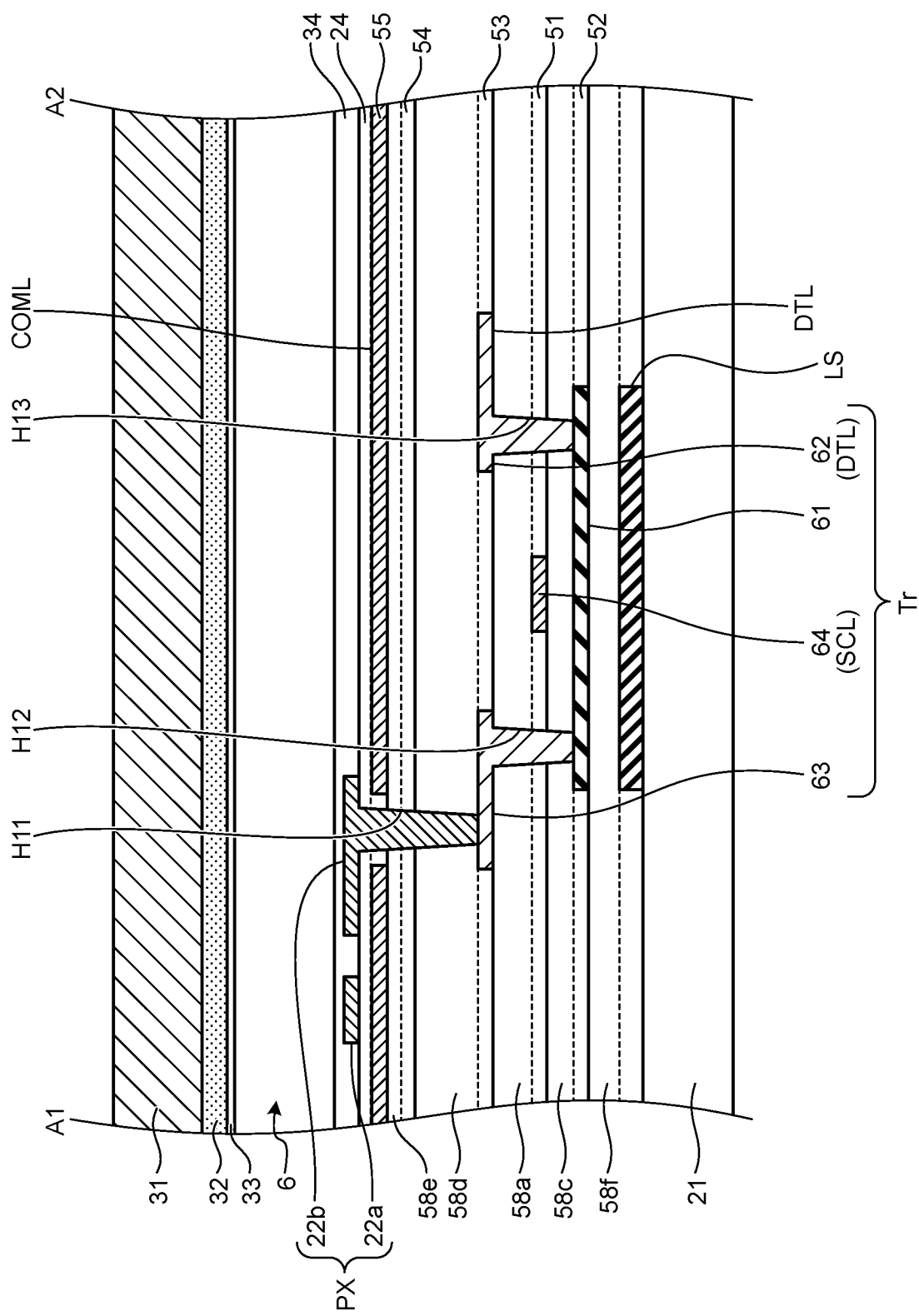

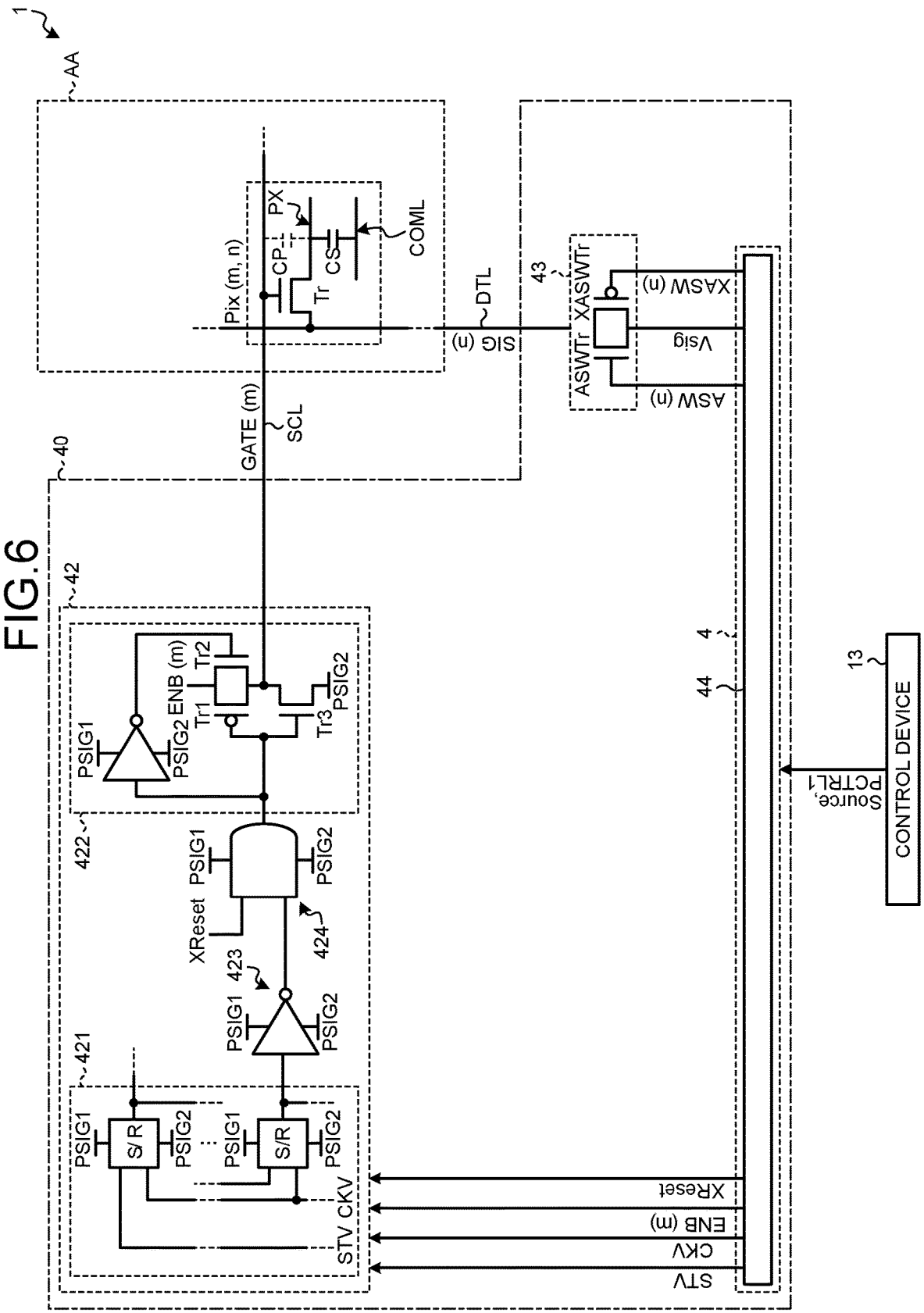

DISPLAY DEVICE

CROSS-REFERENCE TO RELATED APPLICATION

This application claims the benefit of priority from Japanese Patent Application No. 2022-131884 filed on Aug. 22, 2022, the entire contents of which are incorporated herein by reference.

BACKGROUND

1. Technical Field

What is disclosed herein relates to a display device.

2. Description of the Related Art

Conventionally disclosed are liquid crystal display devices that can quickly erase an afterimage and reducing burn-in of the liquid crystal due to residual voltage by short-circuiting a common electrode and a source line and turning on a pixel transistor to write the ground potential of the source line to a pixel and setting the potential of a pixel electrode to the ground potential when the power is turned off. Also disclosed are liquid crystal display devices that turn on, when shifting from an operating state to a non-operating state, the gates of all the TFTs and set a liquid crystal drive power supply to the ground potential, thereby discharging liquid crystal drive voltage stored in the liquid crystal and holding capacitance.

The conventional technologies described above do not consider that, when the potential of the gate signal becomes an off potential after the potential of the pixel electrode is set to the ground potential, the potential of the pixel electrode fluctuates through the drain-to-gate capacitance of the pixel transistor, thereby generating residual voltage in the pixel electrode. Therefore, the conventional technologies may possibly not fully exert the effects of reducing burn-in due to the residual voltage of the pixel electrode.

For the foregoing reasons, there is a need for a display device that can quickly remove residual voltage of a pixel electrode generated in a sequence for turning off the power.

SUMMARY

According to an aspect, a display device includes: a pixel including a pixel transistor and a pixel electrode coupled to a drain of the pixel transistor; a scanning line coupled to a gate of the pixel transistor; a signal line coupled to a source of the pixel transistor; and a drive circuit configured to be supplied with a first power supply voltage signal of a positive value and a second power supply voltage signal of a negative value to drive the pixel transistor. The drive circuit includes: a gate driver configured to supply a scanning signal to the scanning line; a signal line selection circuit configured to supply a pixel signal to the signal line; and a display control circuit configured to control the gate driver and the signal line selection circuit. Holding capacitance is provided between the pixel electrode and a common electrode supplied with a common potential lower than a GND potential in a display operation. The display control circuit is configured to, at first time in a power-off sequence, supply the first power supply voltage signal to the scanning line, supply the GND potential to the common electrode, and supply an adjustment potential of a positive value to the signal line. The display control circuit is configured to supply the GND potential to the scanning line at second time after the first time.

BRIEF DESCRIPTION OF THE DRAWINGS

FIG. 5A is a schematic of a first example of a section along line A1-A2 of FIG. 4;

FIG. 5B is a schematic of a second example of the section along line A1-A2 of FIG. 4;

FIG. 6 is a diagram of an example of the configuration of a drive circuit in the display device according to a first embodiment;

DETAILED DESCRIPTION

Figure 1:
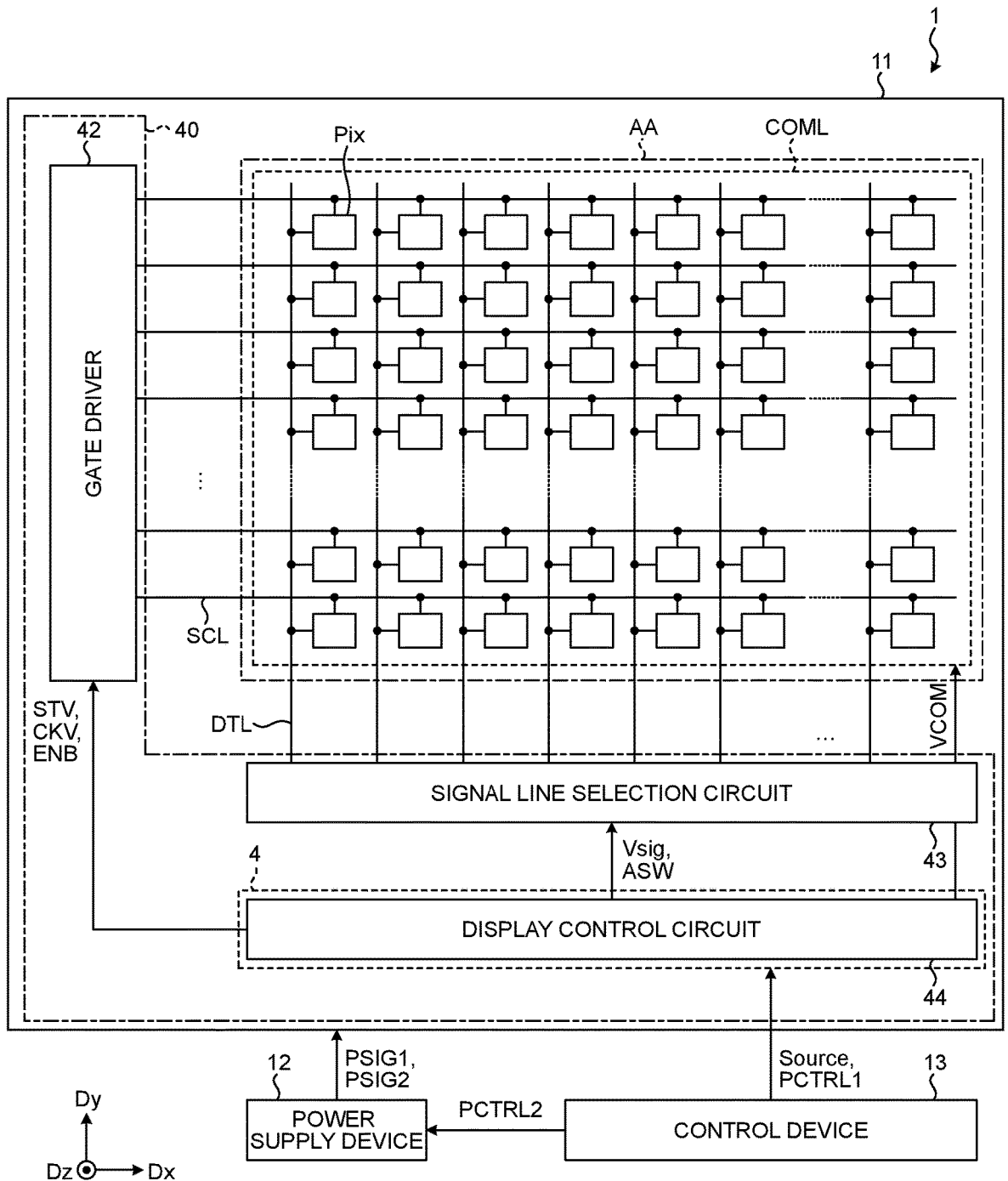
FIG. 1 is a diagram of an example of a schematic configuration of a display device according to an embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

In this disclosure, when an element is described as being "on" another element, the element can be directly on the other element, or there can be one or more elements between the element and the other element.

Figure 2:
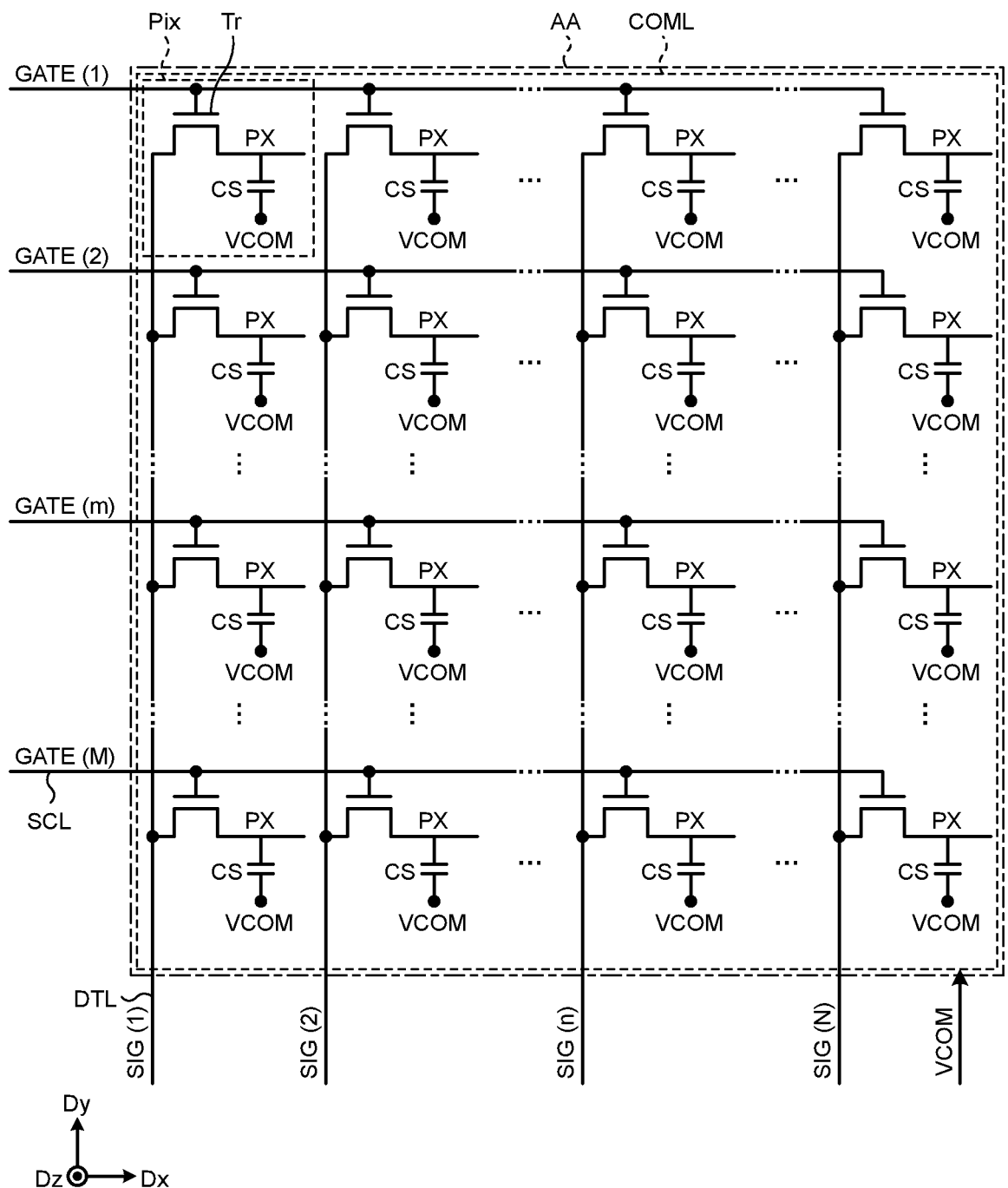
FIG. 2 is a diagram of an example of a pixel array in a display region.

FIG. 1 is a diagram of an example of a schematic configuration of a display device according to an embodiment. FIG. 2 is a diagram of an example of a pixel array in a display region.

A display device 1 according to the present embodiment is a liquid crystal display device including liquid crystal display elements as display elements, for example. The display device 1 according to the present disclosure can employ a column inversion driving method or a frame inversion driving method, for example, as a driving method. The driving method in the display device 1 is not limited to the column inversion driving method or the frame inversion driving method.

The display device 1 has a display region AA on a display panel 11 and includes a drive circuit 40 in a peripheral region around the display region AA. The display device 1 is supplied with electric power from a power supply device 12.

The drive circuit 40 includes a gate driver 42, a signal line selection circuit 43, and a display control circuit 44. The gate driver 42 and the signal line selection circuit 43 are thin-film transistor (TFT) circuits formed in the peripheral region around the display region AA. The display control circuit 44 is included in a driver integrated circuit (IC) 4 mounted on the peripheral region around the display region AA. The driver IC 4 is coupled to a control device 13 via a relay substrate composed of a flexible printed circuit (FPC), for example.

The control device 13 controls power supply from the power supply device 12 to the display device 1. The control device 13 also controls turning-on and -off the display device 1. The power supply device 12 and the control device 13 are mounted on an apparatus (not illustrated) on which the display device 1 is mounted, for example, The display region AA is provided with a plurality of pixels Pix arrayed in a Dx direction (first direction) and a Dy direction (second direction). The display region AA is also provided with scanning lines (gate lines) SCL and signal lines DTL. The scanning line SCL supplies scanning signals (gate signals) GATE to the pixels Pix. The signal line DTL supplies pixel signals SIG to the pixels Pix. The scanning lines SCL according to the present embodiment are provided extending in the Dx direction. The signal lines DTL according to the present embodiment are provided extending in the Dy direction.

As illustrated in FIG. 2, each pixel Pix includes a pixel transistor Tr and a pixel electrode PX. The pixel transistor Tr is composed of a thin-film transistor (TFT) and is composed of, for example, an n-channel metal oxide semiconductor (MOS) TFT (hereinafter also referred to as an "n-type TFT"). The source of the pixel transistor Tr is coupled to the signal line DTL, the gate thereof is coupled to the scanning line (gate line) SCL, and the drain thereof is coupled to the pixel electrode PX. Holding capacitance CS is formed between the pixel electrode PX and the common electrode COML.

The scanning signals (gate signals) GATE(1, 2, . . . , m, . . . , and M) are supplied to the gates of the pixel transistors Tr of the pixels Pix arrayed in the row direction (Dx direction) via the scanning lines (gate lines) SCL. The pixel signals SIG(1, 2, . . . , n, . . . , and N) are supplied to the sources of the pixel transistors Tr of the pixels Pix arrayed in the column direction (Dy direction) via the signal lines DTL. While M pixels Pix are arrayed in the column direction (Dy direction), and N pixels Pix are arrayed in the row direction (Dx direction) in the example illustrated in FIG. 2, the present embodiment is not limited thereto. In the following description, a row of the pixels Pix arrayed in the row direction (Dx direction) is also referred to as a pixel row. A column of the pixels Pix arrayed in the column direction (Dy direction) is also referred to as a pixel column.

The pixel Pix according to the present disclosure includes a red pixel for displaying red (R), a green pixel for displaying green (G), and a blue pixel for displaying blue (B), for example. While the pixel array may be a stripe array in which the RGB pixels are arrayed in the row direction (Dx direction), for example, it is not limited to the RGB stripe array. Specifically, a white pixel for displaying white (W), for example, may be disposed as the pixel Pix. Alternatively, the pixel array may be a stripe array in an oblique direction at a predetermined angle with respect to the row direction (Dx direction) or the column direction (Dy direction) or an array in which a plurality of pixel groups that display different colors are periodically disposed in both the row direction (Dx direction) and the column direction (Dy direction).

The power supply device 12 generates first power supply voltage signals PSIG1 of a positive value and second power supply voltage signals PSIG2 of a negative value to be supplied to the display device 1. The first power supply voltage signal PSIG1 is controlled to be at a first potential (VGH) when the display device 1 is operating. The second power supply voltage signal PSIG2 is controlled to be at a second potential (VGL) when the display device 1 is operating. The first potential (VGH) is set to 7 V, for example. The second potential (VGL) is set to −7 V, for example. The first potential (VGH) supplied when the display device 1 is operating is not limited to 7 V. The second potential (VGL) supplied when the display device 1 is operating is not limited to −7 V.

The control device 13 transmits video signals Source serving as original signals of video to be displayed on the display device 1 to the display device 1. The control device 13 also transmits first power supply control signals PCTRL1 to the display device 1 to control turning-on and turning-off the display device 1. The control device 13 also transmits second power supply control signals PCTRL2 to the power supply device 12 to control power supply from the power supply device 12 to the display device 1.

The control device 13 includes, for example, a central processing unit (CPU) and a storage device, such as a memory. The control device 13 can implement display functions of the display device 1 by executing computer programs using these hardware resources, such as the CPU and the storage device. The control device 13 performs control such that the driver IC 4 can handle an image to be displayed on the display device 1 as image input gradation information in accordance with the execution results of the computer programs.

The display control circuit 44 controls the display operation in the display region AA by controlling the gate driver 42 and the signal line selection circuit 43. The display control circuit 44 receives various control signals, such as the video signals Source and the first power supply control signal PCTRL1, from the control device 13. The display control circuit 44 converts the video signals Source received from the control device 13 into image signals Vsig and outputs them. The image signal Vsig is a signal obtained by time-division multiplexing a pixel signal Sig corresponding to the RGB pixel array, for example. The display control circuit 44 supplies a common potential VCOM to the common electrode COML.

The display control circuit 44 also functions as an interface (I/F) and a timing generator between the signal line selection circuit 43 and the control device 13. The driver IC 4 including the display control circuit 44 may be mounted not on the display panel 11 but on a relay substrate coupled to the display panel 11. The gate driver 42 and the signal line selection circuit 43 may be included in the driver IC 4.

Figure 3:
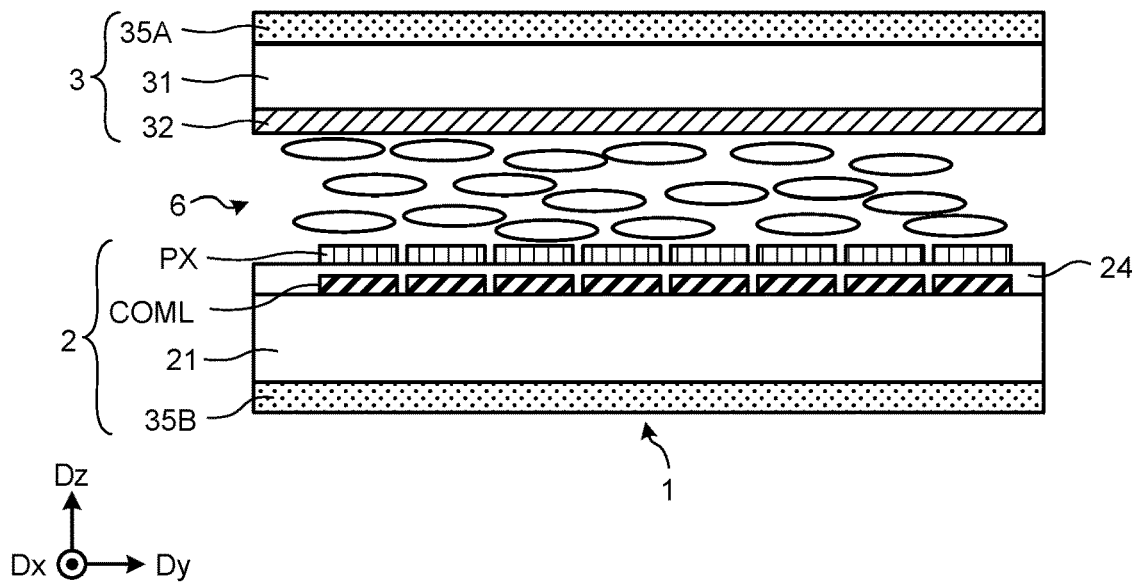
FIG. 3 is a sectional view of a schematic sectional structure of the display device.
Figure 4:
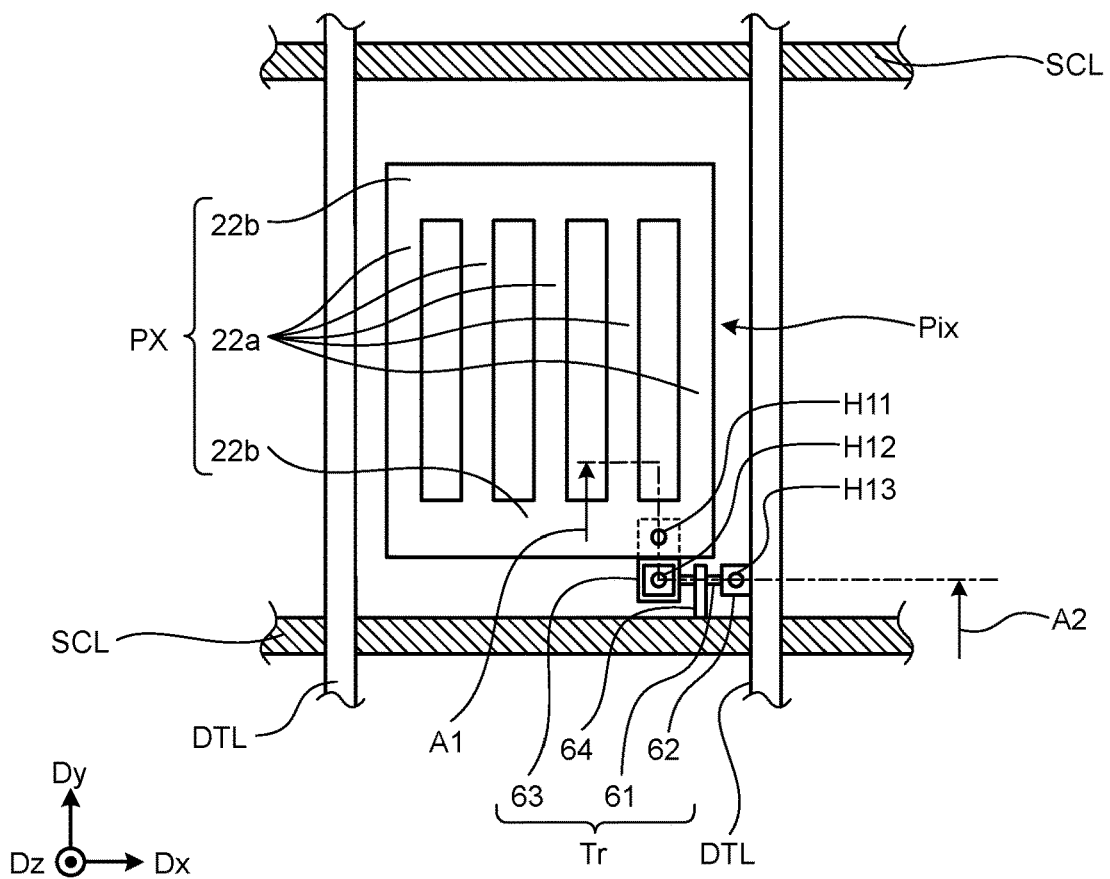
FIG. 4 is a plan view of an exemplary configuration of a pixel.

The following describes a schematic structure of the display device 1 according to the embodiment with reference to FIGS. 3 to 5B. FIG. 3 is a sectional view of a schematic sectional structure of the display device. FIG. 4 is a plan view of an exemplary configuration of the pixel. FIG. 5A is a schematic of a first example of a section along line A1-A2 of FIG. 4. In the first example illustrated in FIG. 5A, a bottom-gate transistor is used as the pixel transistor Tr. FIG. 5B is a schematic of a second example of the section along line A1-A2 of FIG. 4. In the second example illustrated in FIG. 5B, a top-gate transistor is used as the pixel transistor Tr.

An array substrate 2 includes a first substrate 21, a plurality of pixel electrodes PX, the common electrodes COML, and an insulating layer 24. The first substrate 21 is made of glass or transparent resin. The insulating layer 24 insulates the pixel electrodes PX and the common electrodes COML from each other. The pixel electrodes PX are arrayed on the upper side of the first substrate 21 in a matrix (row-column configuration), for example. The common electrodes COML are provided between the first substrate 21 and the pixel electrodes PX.

The pixel electrodes PX are provided corresponding to the pixels Pix. The pixel signal SIG for performing a display operation is supplied from the signal line selection circuit 43 to the pixel electrode PX via the signal line DTL and the pixel transistor Tr. In the display operation, the common potential VCOM for display serving as a voltage signal is supplied from the driver IC 4 to the common electrode COML. The common potential VCOM is preferably different from the ground (GND) potential and is approximately −0.7 V, for example. The common potential VCOM is set to the optimum value that does not cause flicker in the driving method, such as the column inversion driving method and the frame inversion driving method. While the common potential VCOM is preferably a fixed potential, it may have a waveform composed of AC square waves.

The pixel electrode PX and the common electrode COML are made of light-transmitting conductive material, such as indium tin oxide (ITO). A polarizing plate 35B is provided on the lower side of the first substrate 21 with an adhesive layer (not illustrated) interposed therebetween.

A counter substrate 3 includes a second substrate 31, a color filter 32, and a light-shielding layer (not illustrated). The second substrate 31 is made of glass or transparent resin. The color filter 32 and the light-shielding layer are formed on one surface of the second substrate 31. A polarizing plate 35A is provided on the upper side of the second substrate 31 with an adhesive layer (not illustrated) interposed therebetween.

The array substrate 2 and the counter substrate 3 are disposed facing each other with a predetermined gap (cell gap) interposed therebetween. A liquid crystal layer 6 serving as a display functional layer is provided in the space between the first substrate 21 and the second substrate 31. The liquid crystal layer 6 modulates light passing therethrough by changing the orientation state of liquid crystal molecules for each pixel Pix in accordance with the state of the electric field between the pixel electrode PX and the common electrode COML. The present embodiment uses liquid crystal in a lateral electric field mode, such as in-plane switching (IPS) the examples of which includes fringe field switching (FFS).

The array substrate 2 is provided with the pixel transistors Tr of the respective pixels Pix and wiring, such as the signal lines DTL that supply the pixel signals SIG to the pixel electrodes PX and the scanning lines (gate lines) SCL that supply the gate signals GATE for driving the pixel transistors Tr. The signal lines DTL and the scanning lines (gate lines) SCL extend in a plane parallel to the surface of the first substrate 21.

As illustrated in FIG. 4, the region surrounded by the scanning lines (gate lines) SCL and the signal lines DTL corresponds to the pixel Pix. The pixel electrode PX includes a plurality of strip electrodes 22a and connections 22b.

As illustrated in FIG. 4, the pixel transistor Tr includes a semiconductor 61, a source electrode 62, a drain electrode 63, and a gate electrode 64.

As illustrated in FIG. 5A, a gate line layer 51 is provided on the upper side of the first substrate 21 in a configuration using a bottom-gate transistor as the pixel transistor Tr. The gate line layer 51 is provided with the gate electrode 64 (scanning line (gate line) SCL). An insulating layer 58a (second insulating layer) is provided on the upper side of the first substrate 21 in a manner covering the gate electrode 64. A semiconductor layer 52 is provided on the upper side of the insulating layer 58a. The semiconductor layer 52 is provided with the semiconductor 61. A signal line layer 53 is provided on the upper side of the semiconductor layer 52 with an insulating layer 58c (first insulating layer) interposed therebetween.

As illustrated in FIG. 5B, a light shield LS is provided on the upper side of the first substrate 21 in a configuration using a top-gate transistor as the pixel transistor Tr. The semiconductor layer 52 is provided on the upper side of the light shield LS with an insulating layer 58f interposed therebetween. The semiconductor layer 52 is provided with the semiconductor 61. The gate line layer 51 is provided on the upper side of the semiconductor layer 52 with the insulating layer 58c interposed therebetween. The gate line layer 51 is provided with the gate electrode 64. The insulating layer 58a is provided on the upper side of the insulating layer 58c in a manner covering the gate electrode 64. The signal line layer 53 is provided on the upper side of the gate line layer 51 with the insulating layer 58a interposed therebetween.

The signal line layer 53 is provided with the drain electrode 63 and the source electrode 62 (signal line DTL). An auxiliary wiring layer 54 is provided on the upper side of the drain electrode 63 and the source electrode 62 (signal line DTL) with an insulating layer 58d (third insulating layer) interposed therebetween. A common electrode layer 55 is provided on the upper side of the auxiliary wiring layer 54 with an insulating layer 58e interposed therebetween. The common electrode layer 55 is provided with the common electrode COML. The auxiliary wiring layer and the common electrode layer may be stacked with no insulating layer interposed therebetween. The pixel electrode PX is provided on the upper side of the common electrode layer 55 with the insulating layer 24 interposed therebetween.

As illustrated in FIGS. 4 and 5A (or 5B), the pixel electrode PX is coupled to the drain electrode 63 of the pixel transistor Tr through a contact hole H11. The drain electrode 63 is coupled to the semiconductor 61 through a contact hole H12. The semiconductor 61 intersects the gate electrode 64 in plan view. The gate electrode 64 is coupled to the scanning line (gate line) SCL and protrudes from one side of the scanning line (gate line) SCL. The semiconductor 61 extends to a position overlapping the source electrode 62 and is electrically coupled to the source electrode 62 through a contact hole H13. The source electrode 62 is coupled to the signal line DTL and protrudes from one side of the signal line DTL.

The semiconductor 61 can be made of known material, such as polysilicon and oxide semiconductor. The use of a transparent amorphous oxide semiconductor (TAOS), for example, can achieve an excellent ability of holding the voltage for video display for a long time (holding ratio) and higher display quality. In addition, an oxide semiconductor including TAOS has a small leak current when the pixel transistor Tr is turned off.

The gate electrode 64 (scanning line (gate line) SCL) is made of aluminum (Al), copper (Cu), silver (Ag), molybdenum (Mo) or an alloy of these metals, for example. The drain electrode 63 and the source electrode 62 (signal line DTL) are made of titanium aluminum (TiAl), which is an alloy of titanium and aluminum, for example.

The insulating layers 24, 58a, 58c, 58d, 58e, and 58f can be made of known insulating material. The insulating layer 58c, for example, can be made of a silicon oxide film ($SiO_2$). The insulating layer 58d is made of an organic insulating film, such as acrylic. With this structure, the surface provided with the common electrode COML is flattened.

In the same manner as the gate electrode 64 (scanning line (gate line) SCL), the auxiliary wiring layer 54 is made of aluminum (Al), copper (Cu), silver (Ag), molybdenum (Mo) or an alloy of these metals, for example.

In the display device 1 having the schematic structure described above, not only the holding capacitance CS is formed between the pixel electrode PX and the common electrode COML, but also parasitic capacitance is generated between the pixel electrode PX and other conductive members.

In liquid crystal display devices, it is necessary to reset (discharge) the potential held in the pixel electrode when the power is turned off because the output of the drive circuit is high impedance when the power is turned off. The control procedure for resetting the potential held in the pixel electrode when the power is turned off is also referred to as "power-off sequence".

First Embodiment

The following describes a specific configuration of the drive circuit 40 and the power-off sequence of the display device 1 according to the first embodiment.

FIG. 6 is a diagram of an example of the configuration of the drive circuit in the display device according to the first embodiment. FIG. 6 illustrates an example of a circuit configuration corresponding to one pixel Pix(m,n). The pixel Pix(m,n) refers to the n-th pixel Pix counting from the leftmost pixel in the FIG. 2 out of the pixels Pix arrayed in the row direction (Dx direction) in the pixel array illustrated in FIG. 2 and the m-th pixel Pix counting from the topmost pixel in FIG. 2 out of the pixels Pix arrayed in the column direction (Dy direction). In FIG. 6, parasitic capacitance CP generated between the pixel electrode PX and the scanning line (gate line) SCL is represented by a dashed line.

Circuit elements included in the drive circuit 40 operate by being supplied with the first power supply voltage signal PSIG1 and the second power supply voltage signal PSIG2 from the power supply device 12. When the display device 1 is operating, the potential (first potential VGH) of the first power supply voltage signal PSIG1 supplied from the power supply device 12 is set to a high potential of the scanning signal (gate signal) GATE(m) to be supplied to the gate of the pixel transistor Tr. When the display device 1 is operating, the potential (second potential VGL) of the second power supply voltage signal PSIG2 supplied from the power supply device 12 is set to a low potential of the scanning signal GATE(m) to be supplied to the gate of the pixel transistor Tr.

The display control circuit 44 (driver IC 4) controls the gate driver 42 and the signal line selection circuit 43. Specifically, the display control circuit 44 supplies synchronization signals, such as start pulse STV and shift clock CKV, and scanning line drive signals ENB to the gate driver 42. The display control circuit 44 also supplies signal line selection control signals ASW(n) and XASW(n) to the signal line selection circuit 43.

The display control circuit 44 according to the present disclosure supplies reset signals XReset to the gate driver 42. The reset signal XReset is a signal for turning on the pixel transistors Tr of all the pixels Pix in the display region AA and resetting the potential of the pixel electrodes PX in the power-off sequence. The reset signal XReset is a signal set to a high potential (first potential VGH) in the display operation and to a low potential (second potential VGL) in the power-off sequence.

The gate driver 42 includes a shift register circuit 421 and a scanning line drive circuit 422 as major circuit elements for performing a display operation. The gate driver 42 according to the present disclosure includes an AND circuit 424 that outputs a low potential (second potential VGL) to the scanning line drive circuit 422 when at least the reset signal XReset is at a low potential (second potential VGL).

The shift register circuit 421 is a circuit that generates a signal at a high potential (first potential VGH) in selecting the m-th pixel row based on the synchronization signals, such as the start pulse STV and the shift clock CKV, output from the display control circuit 44.

Specifically, when the shift clock CKV is at a high potential, for example, the shift register circuit 421 acquires the output (or the start pulse STV) of a shift register S/R at the preceding stage. When the shift clock CKV is at a low potential, the shift register circuit 421 blocks the path for acquiring the output (or the start pulse STV) of the shift register S/R at the preceding stage and holds the value by a latching operation in the shift register S/R.

The output signal of the shift register circuit 421 is logically inverted by an inverter circuit 423. The output signal of the inverter circuit 423 is received by the scanning line drive circuit 422 via the AND circuit 424 in the display operation, that is, when the reset signal XReset is at a high potential (first potential VGH).

The scanning line drive circuit 422 is a circuit that generates the scanning signal GATE(m) to be supplied to the gate of the pixel transistor Tr based on the signal output from the AND circuit 424 and the scanning line drive signal ENB output from the display control circuit 44. The high potential of the scanning line drive signal ENB is set to the first potential VGH.

Specifically, when the signal output from the AND circuit 424 is at a high potential (first potential VGH) in the display operation, the scanning line drive circuit 422 turns off a first transistor Tr1 composed of a p-channel MOS TFT (hereinafter also referred to as a "p-type TFT") and a second transistor Tr2 composed of an n-type TFT, and turns on a third transistor Tr3 composed of an n-type TFT. As a result, the output potential of the scanning line drive circuit 422 becomes the second potential VGL, and the pixel transistor Tr of the pixel Pix(m,n) is turned off.

When the signal output from the AND circuit 424 is at a low potential (second potential VGL) in the display operation, the scanning line drive circuit 422 turns on the first transistor Tr1 and the second transistor Tr2 and turns off the third transistor Tr3. As a result, the output potential of the scanning line drive circuit 422 becomes the first potential VGH, which is the high potential of the scanning line drive signal ENB, and the pixel transistor Tr of the pixel Pix(m,n) is turned on.

The signal line selection circuit 43 is a switch circuit that selectively outputs the image signal Vsig output from the display control circuit 44 as the pixel signal SIG in selecting the n-th pixel column. Specifically, the signal line selection circuit 43 includes a switch transistor ASWTr composed of an n-type TFT and a switch transistor XASWTr composed of a p-type TFT.

When the signal line selection control signal ASW(n) output from the display control circuit 44 is at a high potential, and the signal line selection control signal XASW (n) is at a low potential, the signal line selection circuit 43 turns on the switch transistors ASWTr and XASWTr. When the signal line selection control signal ASW(n) output from the display control circuit 44 is at a low potential, and the signal line selection control signal XASW(n) is at a high potential, the switch transistors ASWTr and XASWTr in the signal line selection circuit 43 are turned off.

The signal line selection control signal ASW(n) and the signal line selection control signal XASW(n) are complementary signals logically inverted from each other. The signal line selection control signal XASW(n) may be generated by logically inverting the signal line selection control signal ASW(n). The signal line selection control signal ASW(n) may be generated by logically inverting the signal line selection control signal XASW(n). The signal line selection circuit 43 may include only a switch transistor composed of an n-type TFT or a p-type TFT. If the switch transistor is composed of an n-type TFT, the signal line selection control signal XASW is not required. If the switch transistor is composed of a p-type TFT, the signal line selection control signal ASW is not required.

By the operations of the circuit elements of the drive circuit 40 described above, in selecting the pixel Pix(m,n) in the display operation, the pixel transistor Tr of the pixel Pix(m,n) is turned on, and the pixel signal SIG is written to the pixel electrode PX of the pixel Pix(m,n). Subsequently, the pixel transistor Tr of the pixel Pix(m,n) is turned off, and the potential of the pixel signal SIG is held in the holding capacitance CS in the period until the pixel Pix(m,n) is turned on again in the next frame. By performing the control described above on all the pixels Pix in the display region AA in the selection order corresponding to the predetermined driving method (e.g., the column inversion driving method or the frame inversion driving method), the display operation in the display region AA can be performed.

In the power-off sequence of the display device 1 described above, the display control circuit 44 sets the reset signal XReset to a low potential (second potential VGL). As a result, the low potential (second potential VGL) is supplied to the scanning line drive circuit 422 to set the potentials of all the scanning lines SCL to a low potential (second potential VGL), the pixel transistors Tr of all the pixels Pix in the display region AA are turned on, and the potential of the pixel electrodes PX is reset. Therefore, the display device 1 can reduce burn-in of the liquid crystal that would be caused due to the residual voltage of the pixel electrodes PX.

Figure 7:
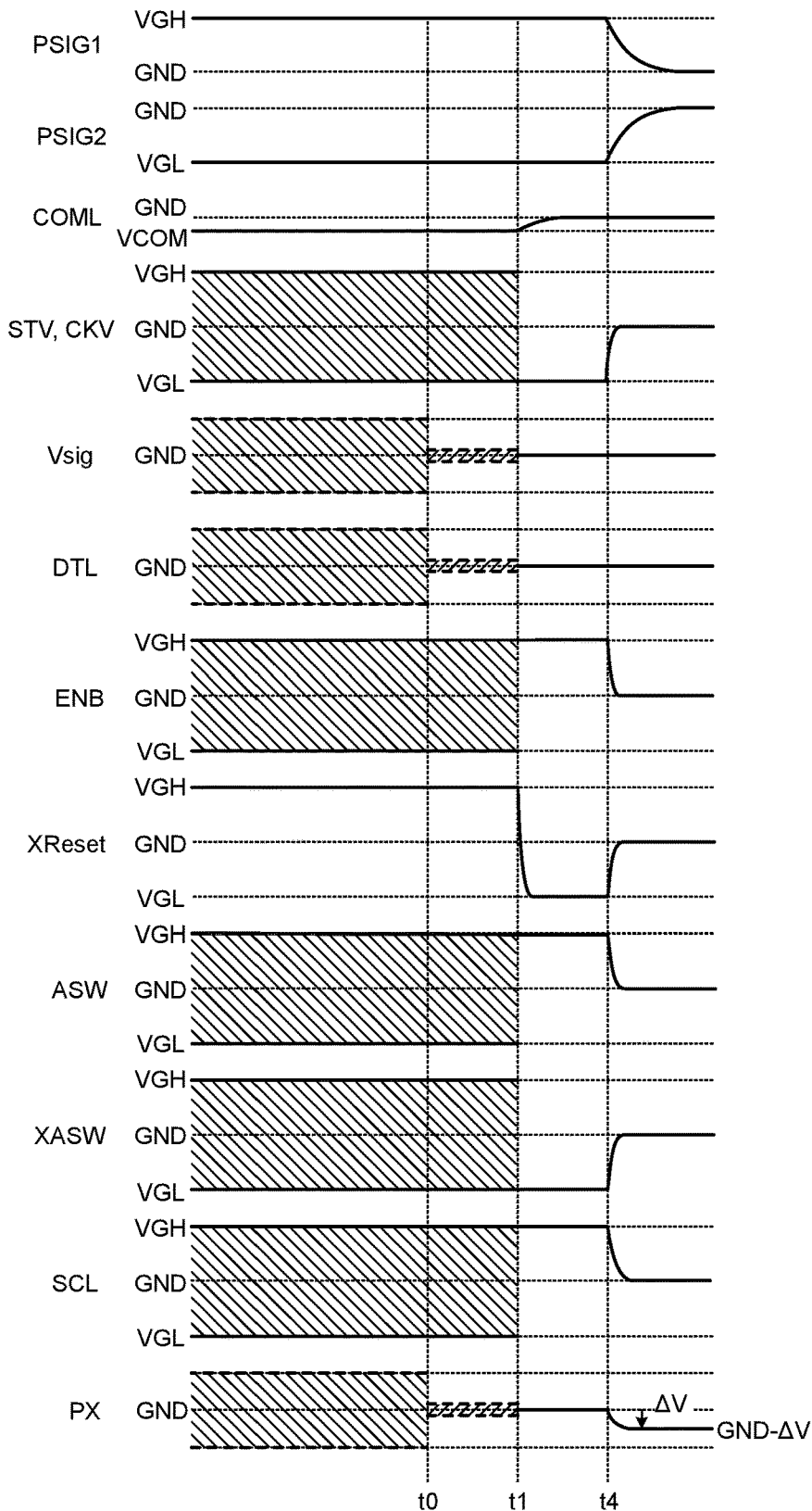
FIG. 7 is a timing chart of an example of a power-off sequence according to a comparative example.

FIG. 7 is a timing chart of an example of the power-off sequence according to a comparative example. The display control circuit 44 according to the present disclosure performs the power-off sequence of the display device 1 based on the first power supply control signal PCTRL1 output from the control device 13. In the example illustrated in FIG. 7, the power-off sequence starts at time t0. Before time t0, the normal display operation described above is performed.

When the power-off sequence starts at time t0, the display device 1 displays a black screen. Specifically, the display control circuit 44 performs the display operation by setting the gradation of the image signals Vsig corresponding to all the pixels Pix in the display region AA to "0". Therefore, the potential held in the pixel electrodes PX can be set to the minimum value. In the following description, the period for displaying the black screen is also referred to as a "black insertion period". The black insertion period is not necessarily provided.

When the black insertion period ends at time t1, the display control circuit 44 supplies the GND potential as the potential supplied to the signal line DTL. At this time, the display control circuit 44 sets the signal line selection control signals ASW corresponding to all the signal lines DTL to a high potential and sets the signal line selection control signals XASW corresponding to all the signal lines DTL to a low potential. As a result, the switch transistors ASWTr and XASWTr are turned on, and the GND potential is supplied to the signal lines DTL, and the potentials of the signal lines DTL are set to the GND potential.

At time t1, the display control circuit 44 stops supplying the common potential VCOM to the common electrodes COML. As a result, the potential of the common electrodes COML converges to the GND potential by time t4. At time t1, the display control circuit 44 sets all the scanning line drive signals ENB to a high potential (first potential VGH). The display control circuit 44 sets the reset signal XReset to a low potential (second potential VGL). Therefore, the potential of the output signal of the AND circuit 424 becomes a low potential (second potential VGL). As a result, the first transistor Tr1 and the second transistor Tr2 of the scanning line drive circuit 422 are turned on, the third transistor Tr3 is turned off, the potentials of all the scanning lines SCL become the first potential VGH supplied as the high potential of the scanning line drive signal ENB, and the pixel transistors Tr of all the pixel Pix are turned on. As a result, each of the pixel electrodes PX of all the pixels Pix is electrically coupled to the signal line DTL at the GND potential via the turned-on pixel transistors Tr, and the potentials of the pixel electrodes PX of all the pixels Pix are reset to the GND potential.

At time t3 after resetting the potentials of the pixel electrodes PX of all the pixels Pix, the power supply device 12 stops supplying the first power supply voltage signal PSIG1 and the second power supply voltage signal PSIG2 to the display device 1 based on the second power supply control signal PCTRL2 output from the control device 13. As a result, the driver IC 4 stops the control, and the potentials of the control signals, such as the synchronization signals including the start pulse STV and the shift clock CKV, all the scanning line drive signals ENB, the reset signal XReset, and the signal line selection control signals ASW and XASW corresponding to all the signal lines DTL, become the GND potential.

The potentials of the first power supply voltage signal PSIG1 and the second power supply voltage signal PSIG2 are gradually decreased by a power supply smoothing capacitor (not illustrated) provided to the power supply device 12. Therefore, the potentials of the first power supply voltage signal PSIG1 and the second power supply voltage signal PSIG2 converge to the GND potential after the potentials of the control signals become the GND potential. In other words, the potentials of the control signals output from the driver IC converge to the GND potential more sharply than the first power supply voltage signal PSIG1 and the second power supply voltage signal PSIG2.

At this time, the scanning lines SCL each have a sharp change in potential from the first potential VGH, which is the high potential of the scanning line drive signal ENB of the scanning signal GATE, to the GND potential. As described above, the parasitic capacitance CP is formed between the drain and the gate of the pixel transistor Tr. The drastic voltage change in the scanning line SCL, however, acts on the parasitic capacitance CP, whereby the potential of the pixel electrode PX decreases from the GND potential, which is the original reset potential.

Figure 8:
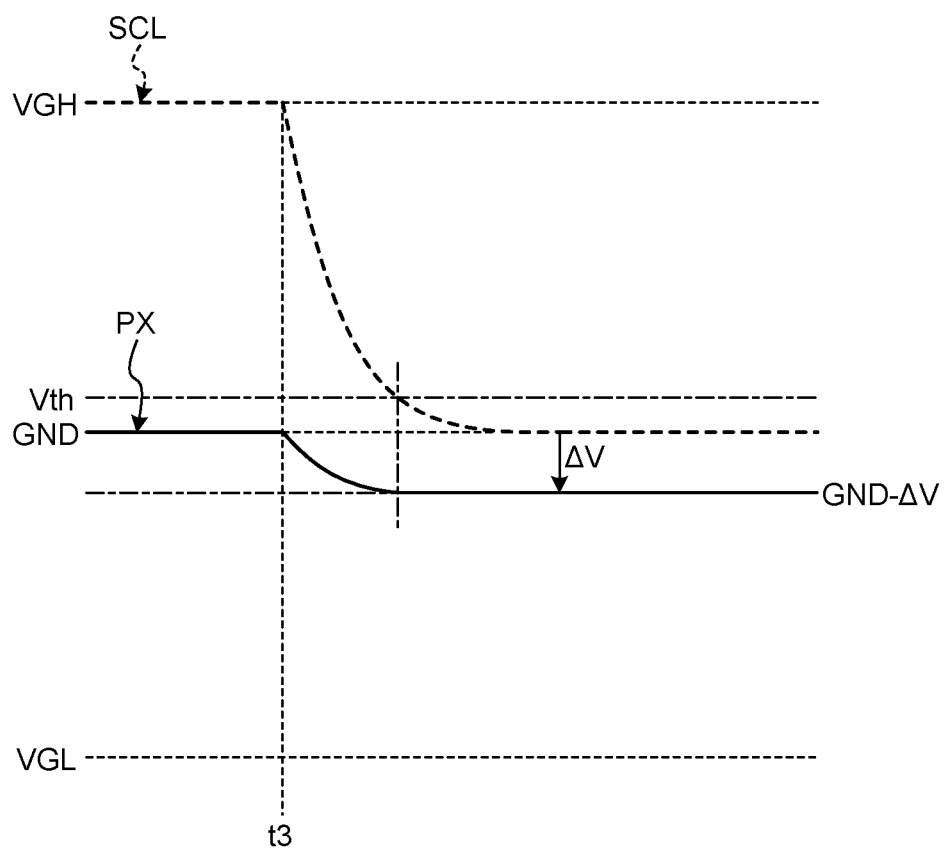
FIG. 8 is an enlarged timing chart of a potential fluctuation of a pixel electrode after resetting by the power-off sequence illustrated in FIG. 7.

The following describes the principle that the potential of the pixel electrode PX decreases in greater detail. FIG. 8 is an enlarged timing chart of a potential fluctuation of the pixel electrode after resetting by the power-off sequence illustrated in FIG. 7. The solid line in FIG. 8 indicates the potential of the pixel electrode PX. The dashed line in FIG. 8 indicates the potential of the scanning line (gate line) SCL. In this comparative example, at time t3, the potential of the common electrode COML converges to the GND potential, and the potential of the signal line DTL also converges to the GND potential and then is in a high impedance state (floating state).

As illustrated in FIG. 8, when the gate potential of the pixel transistor Tr coupled to the scanning line SCL changes from the first potential VGH to the GND potential, the parasitic capacitance CP discharges due to the change. During the period when the pixel transistor Tr maintains the ON state until the potential of the pixel transistor Tr falls below a threshold voltage Vth, the parasitic capacitance CP is recharged from the signal line DTL via the pixel transistor Tr. If the drop in the gate potential of the pixel transistor Tr is sharp, the discharge rate of the parasitic capacitance CP exceeds the recharge rate of the parasitic capacitance CP. Therefore, the potential of the pixel electrode PX decreases.

In the short period when the pixel transistor Tr maintains the ON state as described above, the signal line DTL that can serve as a supply source of electric charge for recharging the pixel electrode PX is in a high impedance state (floating state) because the signal line selection control signals ASW and XASW are at the GND potential. Therefore, the potential of the signal line DTL decreases from the GND potential due to the supply of electric charge for recharging the pixel electrode PX. As a result, the potential of the pixel electrode PX recharged from the signal line DTL more significantly decreases. When the potential of the pixel transistor Tr falls below the threshold voltage Vth, the pixel transistor Tr is turned off, and the potential of the pixel electrode PX is maintained lower than the GND potential.

As a result, the potential of the pixel electrode PX after time t3 when the driver IC 4 stops the control has a negative potential difference ΔV with respect to the GND potential, which is the potential after the resetting, as the residual voltage (GND−ΔV) as illustrated in FIGS. 7 and 8. It is conceivable that the residual voltage may be gradually released over time due to the leak current generated when the pixel transistor Tr is turned off. However, if a semiconductor, such as a transparent amorphous oxide semiconductor (TAOS) with an excellent voltage holding ratio for video display or an oxide semiconductor having a significantly small leak current when the pixel transistor Tr is turned off, is used as the semiconductor 61, the potential difference ΔV remains in the pixel electrode PX for a long time, which may possibly cause burn-in of the liquid crystal. In addition, the optimum value of the common potential VCOM may possibly fluctuate due to burn-in, thereby causing flicker by the driving method, such as the column inversion driving method and the frame inversion driving method.

Figure 9:
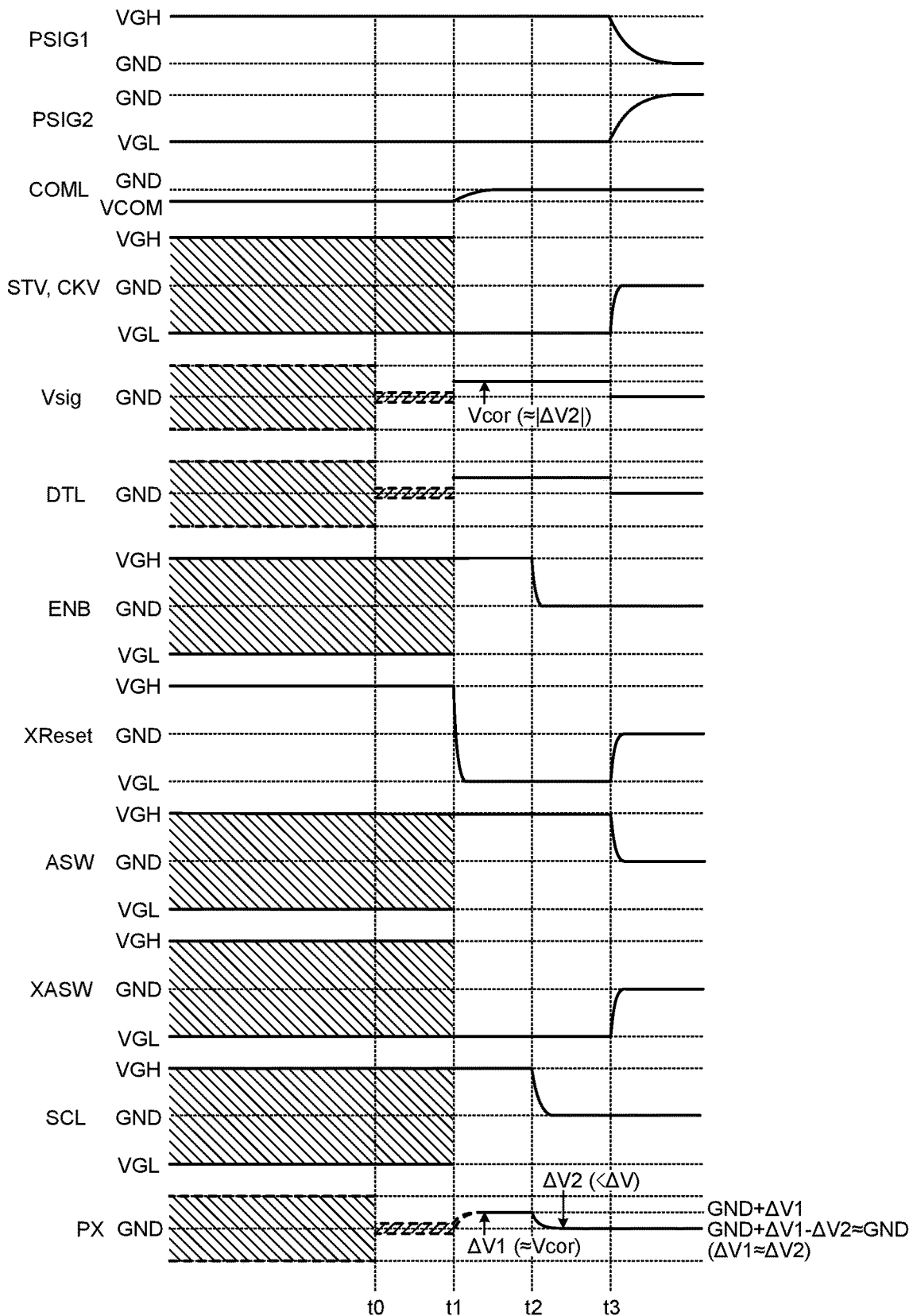
FIG. 9 is a timing chart of an example of the power-off sequence according to the first embodiment.
Figure 10:
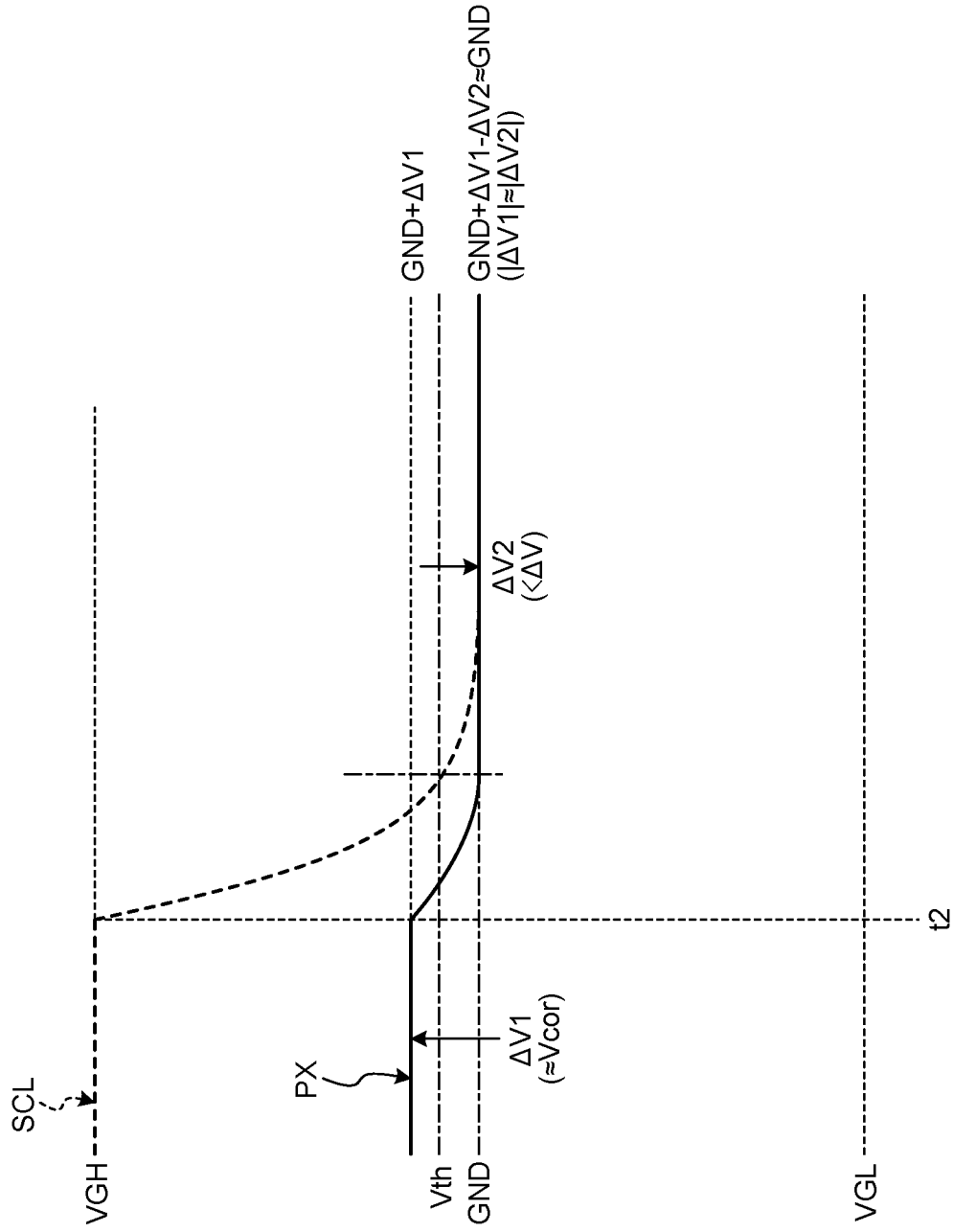
FIG. 10 is an enlarged timing chart of a potential fluctuation of the pixel electrode after resetting by the power-off sequence illustrated in FIG. 9.

FIG. 9 is a timing chart of an example of the power-off sequence according to the first embodiment. FIG. 10 is an enlarged timing chart of a potential fluctuation of the pixel electrode after resetting by the power-off sequence illustrated in FIG. 9. The solid line in FIG. 10 indicates the potential of the pixel electrode PX. The dashed line in FIG. 10 indicates the potential of the scanning line (gate line) SCL. The following describes different points from the power-off sequence according to the comparative example illustrated in FIGS. 7 and 8 in greater detail, and duplicate explanation may be omitted.

In the power-off sequence of the display device 1 according to the first embodiment, when the black insertion period ends at time t1 (first time), the display control circuit 44 supplies a positive adjustment potential Vcor as the potential to be supplied to the signal line DTL. The adjustment potential Vcor corresponds to the magnitude of ΔV2, which is the decrease in potential of the signal line DTL serving as a supply source of electric charge for recharging the pixel electrode PX at time t2 (second time) (Vcor≈|ΔV2|). At this time, the display control circuit 44 sets the signal line selection control signals ASW corresponding to all the signal lines DTL to a high potential and sets the signal line selection control signals XASW corresponding to all the signal lines DTL to a low potential. As a result, the switch transistors ASWTr and XASWTr are turned on, and the adjustment potential Vcor is supplied to the signal lines DTL, and the potential of the signal lines DTL is set to the adjustment potential Vcor.

At time t1 (first time), the display control circuit 44 stops supplying the common potential VCOM to the common electrodes COML. As a result, the potentials of the common electrodes converge to the GND potential. The display control circuit 44 sets all the scanning line drive signals ENB to a high potential (first potential VGH) and sets the reset signal XReset to a low potential (second potential VGL). Therefore, the potential of the output signal of the AND circuit 424 becomes a low potential (second potential VGL). As a result, the first transistor Tr1 and the second transistor Tr2 of the scanning line drive circuit 422 are turned on, the third transistor Tr3 is turned off, the potentials of all the scanning lines SCL become the first potential VGH supplied as the high potential of the scanning line drive signal ENB, and the pixel transistors Tr of all the pixel Pix are turned on. As a result, each of the pixel electrodes PX of all the pixels Pix is electrically coupled to the signal line DTL having the adjustment potential Vcor via the turned-on pixel transistor Tr and is set to a potential obtained by adding a potential difference ΔV1 substantially equivalent to the adjustment potential Vcor to the GND potential, which is the original potential of each of the pixel electrodes PX of all the pixels Pix after the resetting (GND+ΔV1).

After each of the potentials of the pixel electrodes PX of all the pixels Pix is set to the potential (GND+ΔV1) obtained by adding the potential difference ΔV1 (~Vcor) to the GND potential, which is the original potential after the resetting, each of the potentials of all the scanning line drive signals ENB is set to the GND potential at time t2 (second time). As a result, the scanning line SCL has a potential change from the first potential VGH of the scanning line drive signal ENB of the scanning signal GATE to the GND potential. This voltage change in the scanning line SCL is superimposed on the pixel electrode PX via the parasitic capacitance CP generated between the drain and the gate of the pixel transistor Tr.

Specifically, when the gate potential of the pixel transistor Tr coupled to the scanning line SCL changes from the first potential VGH to the GND potential, the parasitic capacitance CP discharges until the pixel transistor Tr is turned off, whereby the potential of the pixel electrode PX decreases. Therefore, the potential of the pixel electrode PX after time t2 (second time) has a potential change of a negative potential difference $\Delta V2$ with respect to the potential obtained by adding the potential difference $\Delta V1$ to the GND potential (GND+$\Delta V1$−$\Delta V2$) as illustrated in FIGS. 9 and 10.

In the power-off sequence of the display device 1 according to the first embodiment, at time t2, the control state of the signal line selection control signals ASW and XASW is maintained. Specifically, the potential of the signal line selection control signal ASW is maintained at a high potential, and the potential of the signal line selection control signal XASW is maintained at a low potential. As a result, the decrease in potential of the signal line DTL serving as a supply source of electric charge for recharging the pixel electrode PX is suppressed compared to the decrease in potential at time t2 of the power-off sequence according to the comparative example illustrated in FIGS. 7 and 8. Therefore, the negative potential difference $\Delta V2$ generated in the pixel electrode PX is smaller than the potential difference $\Delta V$ at time t3 of the power-off sequence according to the comparative example illustrated in FIGS. 7 and 8 ($\Delta V2 < \Delta V$). The potential difference $\Delta V1$ substantially equivalent to the adjustment potential Vcor supplied as the potential of the image signal Vsig at time t1 corresponds to the magnitude of $\Delta V2$, which is the decrease in potential of the signal line DTL serving as the supply source of electric charge for recharging the pixel electrode PX at time t2.

In the power-off sequence of the display device 1 according to the first embodiment, the adjustment potential Vcor supplied as the potential of the image signal Vsig at time t1 is set such that the magnitude of the positive potential difference $\Delta V1$ generated in the pixel electrode PX at time t1 is substantially equivalent to the magnitude of the negative potential difference $\Delta V2$ generated in the pixel electrode PX at time t2($|\Delta V1| \approx |\Delta V2|$). As a result, the potential of the pixel electrode PX after the resetting in the power-off sequence according to the first embodiment converges to the GND potential (GND+$\Delta V1$−$\Delta V2 \approx$GND).

When the driver IC 4 stops the control at time t3 (third time) after time t2 (second time), the potentials of the control signals, such as the synchronization signals including the start pulse STV and the shift clock CKV, the reset signal XReset, and the signal line selection control signals ASW and XASW corresponding to all the signal lines DTL, and the potential of the image signal Vsig become the GND potential. As a result, the potential of the signal line DTL becomes the GND potential. In other words, the signal line DTL is kept to be supplied with the positive adjustment potential Vcor from when the positive adjustment potential Vcor is supplied to the signal line DTL at time t1 (first time) to when the driver IC 4 stops the control at time t3 (third time) after time t2 (second time). In other words, the signal line DTL is kept to be supplied with the positive adjustment potential Vcor during the period from time t1 (first time) when the positive adjustment potential Vcor is supplied to the signal line DTL to at least time t2 (second time).

In the power-off sequence of the display device 1 according to the first embodiment described above, the potential of the pixel electrode PX after time t3 when the driver IC 4 stops the control converges to the GND potential, which is the original potential after the resetting. Therefore, the potential difference $\Delta V1$ remaining in the pixel electrode PX from time t1 to time t2 is quickly removed, thereby reducing burn-in of the liquid crystal that would be caused due to the residual voltage of the pixel electrode PX after the power is turned off. The embodiment can also reduce flicker that would be caused by changes in the optimum value of the common potential VCOM that would be caused due to burn-in.

Second Embodiment

The following describes a specific configuration of a drive circuit 40a and the power-off sequence of a display device 1a according to a second embodiment.

Figure 11:
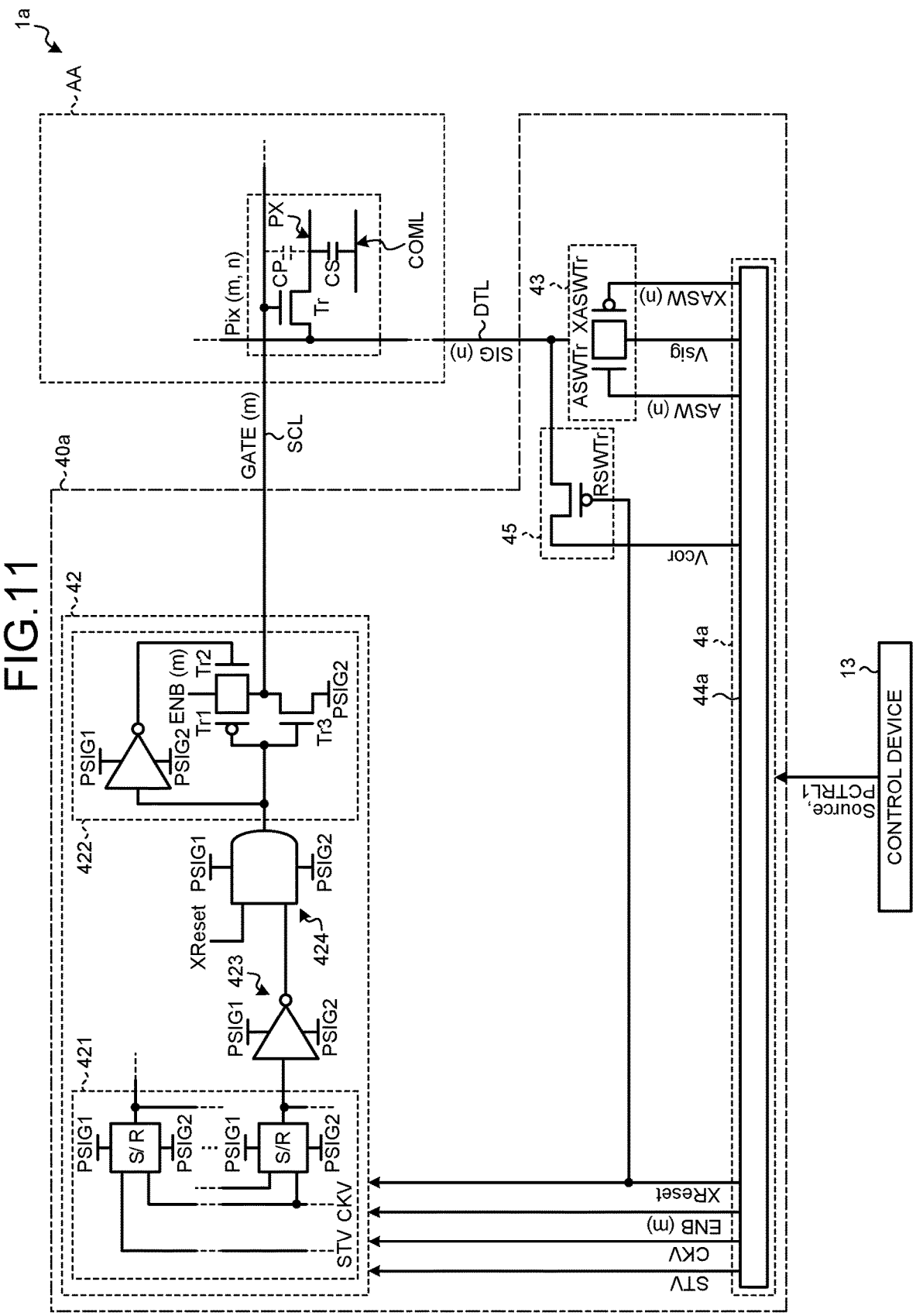
FIG. 11 is a diagram of an example of the configuration of the drive circuit in the display device according to a second embodiment.
Figure 12:
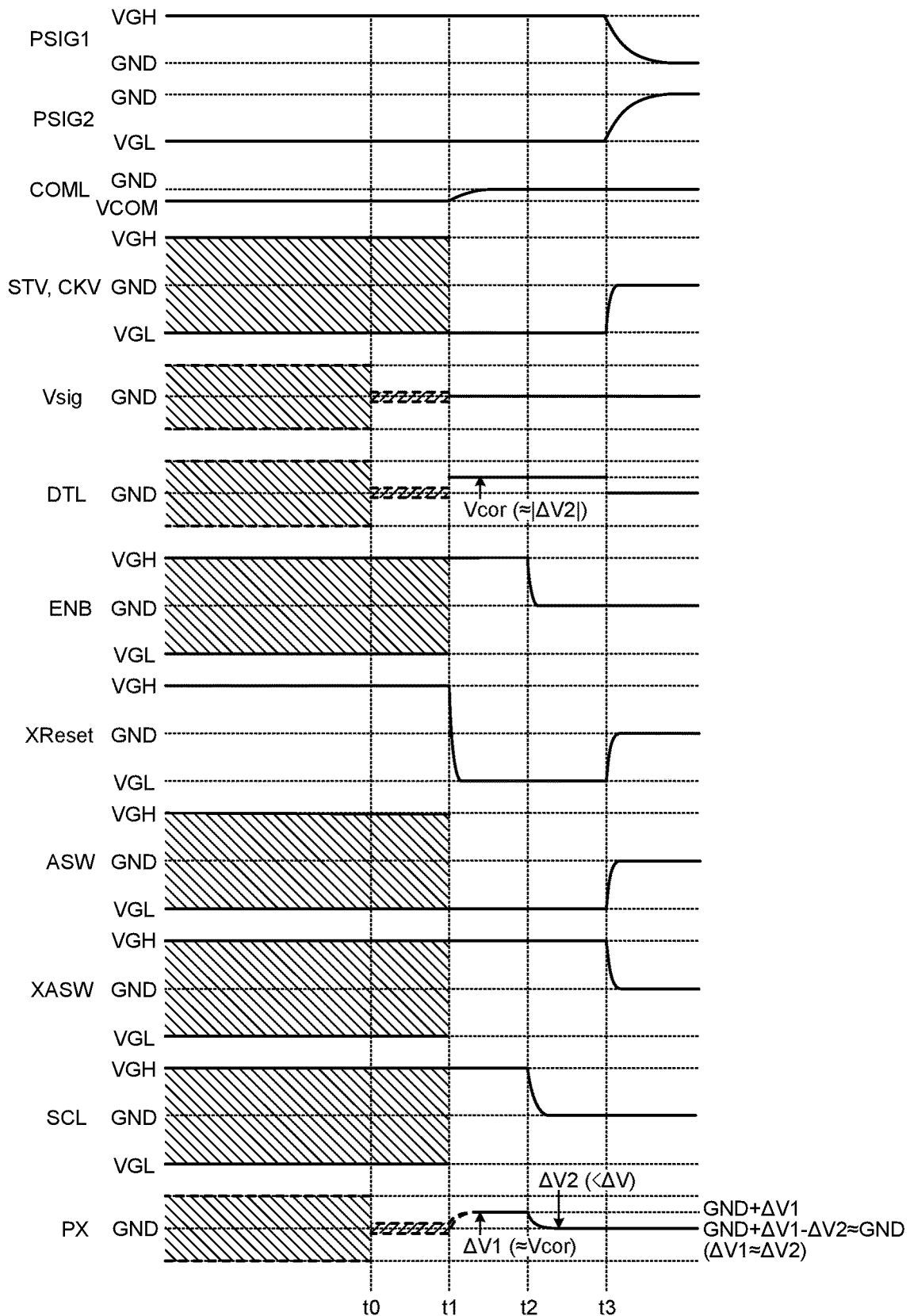
FIG. 12 is a timing chart of an example of the power-off sequence according to the second embodiment.

FIG. 11 is a diagram of an example of the configuration of the drive circuit in the display device according to the second embodiment. FIG. 12 is a timing chart of an example of the power-off sequence according to the second embodiment. The following describes points different from the configuration of the drive circuit of the display device 1 according to the first embodiment and from the power-off sequence according to the first embodiment in greater detail, and duplicate explanation may be omitted.

The drive circuit 40a according to the second embodiment includes a switch circuit 45 instead of a configuration supplying the positive adjustment potential Vcor as the potential of the image signal Vsig at time t1 in the power-off sequence. The switch circuit 45 is a configuration that sets the potential of the signal line DTL to the positive adjustment potential Vcor in the low potential (second potential VGL) period of the reset signal XReset in the power-off sequence The switch circuit 45 includes a switch transistor RSWTr composed of a p-type TFT, for example. The drain of the switch transistor RSWTr is coupled to the signal line DTL, and the source of the switch transistor RSWTr is supplied with the adjustment potential Vcor from a display control circuit 44a (driver IC 4a). The gate of the switch transistor RSWTr is supplied with the reset signal XReset from the display control circuit 44a.

In the power-off sequence of the display device 1a according to the second embodiment, the signal line selection control signals ASW corresponding to all the signal lines DTL are set to a low potential, and the signal line selection control signals XASW corresponding to all the signal lines DTL are set to a high potential at time t1 (first time). As a result, the switch transistors ASWTr and XASWTr are turned off. At the same time, the reset signal XReset is set to a low potential (second potential VGL), and the switch transistor RSWTr of the switch circuit 45 is turned on. As a result, the adjustment potential Vcor is supplied from the display control circuit 44a to the signal line DTL, and the potential of the signal line DTL is set to the adjustment potential Vcor. At this time, each of the pixel electrodes PX of all the pixels Pix is electrically coupled to the signal line DTL set to the adjustment potential Vcor by the switch circuit 45 via the turned-on pixel transistor Tr and is set to a potential obtained by adding the potential difference $\Delta V1$ substantially equivalent to the adjustment potential Vcor to the GND potential, which is the original potential of each of the pixel electrodes PX of all the pixels Pix after the resetting (GND+$\Delta V1$). The operations after time t2 (second time) are the same as those in the power-off sequence of the display device 1 according to the first embodiment. In other words, in the same manner as the first embodiment, the signal line DTL is kept to be supplied with the positive adjustment potential Vcor from when the positive adjustment potential Vcor is supplied to the signal line DTL at time t1 (first time) to when the driver IC 4*a* stops the control at time t3 (third time) after time t2 (second time). In other words, the signal line DTL is kept to be supplied with the positive adjustment potential Vcor during the period from time t1 (first time) when the positive adjustment potential Vcor is supplied to the signal line DTL to at least time t2 (second time).

Also in the power-off sequence of the display device 1*a* according to the second embodiment described above, in the same manner as the first embodiment, the potential of the pixel electrode PX after time t3 when the driver IC 4*a* stops the control converges to the GND potential, which is the original potential after the resetting. Therefore, in the same manner as the first embodiment, the potential difference ΔV1 remaining in the pixel electrode PX from time t1 to time t2 is quickly removed, thereby reducing burn-in of the liquid crystal that would be caused due to the residual voltage of the pixel electrode PX after the power is turned off. The embodiment can also reduce flicker that would be caused by changes in the optimum value of the common potential VCOM that would be caused due to burn-in.

The display devices 1 and 1*a* are not limited to liquid crystal display devices and may be organic EL displays including organic light-emitting diodes (OLEDs) as display element, for example. Alternatively, the display device 1 may be an inorganic EL display including inorganic light-emitting diodes (micro LEDs) as the display elements. Still alternatively, the display device 1 may be an electrophoretic display (EPD) or a transparent display that displays images on a transmissive display surface.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure.

What is claimed is:

1. A display device comprising:
a pixel comprising a pixel transistor and a pixel electrode coupled to a drain of the pixel transistor;
a scanning line coupled to a gate of the pixel transistor;
a signal line coupled to a source of the pixel transistor; and
a drive circuit configured to be supplied with a first power supply voltage signal of a positive value and a second power supply voltage signal of a negative value to drive the pixel transistor,
wherein the drive circuit comprises:
a gate driver configured to supply a scanning signal to the scanning line;
a signal line selection circuit configured to supply a pixel signal to the signal line; and
a display control circuit configured to control the gate driver and the signal line selection circuit,
wherein a holding capacitance is provided between the pixel electrode and a common electrode supplied with a common potential lower than a GND potential in a display operation,
wherein the display control circuit is configured to, at a first time in a power-off sequence, supply the first power supply voltage signal to the scanning line, supply the GND potential to the common electrode, and supply an adjustment potential of a positive value to the signal line, and
wherein the display control circuit is configured to supply the GND potential to the scanning line at a second time after the first time.

2. The display device according to claim 1,
wherein the display control circuit maintains a state of supplying the adjustment potential to the signal line during a period from the first time to at least the second time.

3. The display device according to claim 1,
wherein the drive circuit comprises a switch circuit configured to supply the adjustment potential to the signal line during a period from the first time to at least the second time, and
wherein the display control circuit turns off the signal line selection circuit during a period from the first time to at least the second time.

4. The display device according to claim 1, further comprising a driver IC including at least the display control circuit.

* * * * *